United States Patent
Kimura

(10) Patent No.: US 12,431,863 B2
(45) Date of Patent: Sep. 30, 2025

(54) FILTER DEVICE

(71) Applicant: Murata Manufacturing Co., Ltd., Nagaokakyo (JP)

(72) Inventor: Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 257 days.

(21) Appl. No.: 18/195,431

(22) Filed: May 10, 2023

(65) Prior Publication Data

US 2023/0283259 A1    Sep. 7, 2023

Related U.S. Application Data

(63) Continuation of application No. PCT/JP2021/041208, filed on Nov. 9, 2021.

(60) Provisional application No. 63/112,247, filed on Nov. 11, 2020.

(51) Int. Cl.
*H03H 9/205* (2006.01)
*H03H 9/02* (2006.01)
*H03H 9/145* (2006.01)
*H03H 9/64* (2006.01)

(52) U.S. Cl.
CPC ........ *H03H 9/205* (2013.01); *H03H 9/02559* (2013.01); *H03H 9/02842* (2013.01); *H03H 9/14541* (2013.01); *H03H 9/6483* (2013.01)

(58) Field of Classification Search
CPC ............... H03H 9/205; H03H 9/02559; H03H 9/02842; H03H 9/14541; H03H 9/6483; H03H 9/174; H03H 9/02228; H03H 9/14547; H03H 9/14558; H03H 9/175; H03H 9/6493; H03H 9/568

USPC .......................................... 333/133, 193–196

See application file for complete search history.

(56) References Cited

U.S. PATENT DOCUMENTS

| | | | |
|---|---|---|---|
| 9,124,240 B2 * | 9/2015 | Shimizu | H03H 9/14594 |
| 10,491,192 B1 | 11/2019 | Plesski et al. | |
| 2002/0140519 A1 | 10/2002 | Takayama et al. | |
| 2014/0145556 A1 | 5/2014 | Kadota | |
| 2018/0102755 A1 | 4/2018 | Takamine | |

(Continued)

FOREIGN PATENT DOCUMENTS

| | | |
|---|---|---|
| JP | 2001285025 A | 10/2001 |
| WO | 2013021948 A1 | 2/2013 |

(Continued)

OTHER PUBLICATIONS

International Search Report in PCT/JP2021/041208, mailed Jan. 25, 2022, 3 pages.

(Continued)

*Primary Examiner* — Jorge L Salazar, Jr.
(74) *Attorney, Agent, or Firm* — Keating & Bennett, LLP

(57) ABSTRACT

A filter device includes first and second acoustic wave resonators each including a support, a piezoelectric layer that has an X-axis, a Y-axis, and a Z-axis that are crystal axes and is made of Y-cut lithium niobate, and an IDT electrode including first and second electrode fingers. When a thickness of the piezoelectric layer is d and a center-to-center distance of the first and second electrode fingers and the second electrode fingers adjacent to each other is p, d/p is less than or equal to 0.5. An absolute value of a first slant angle α1 differs from an absolute value of a second slant angle α2.

20 Claims, 11 Drawing Sheets

(56) References Cited

U.S. PATENT DOCUMENTS

2018/0323769 A1 11/2018 Yamamoto
2020/0036357 A1 1/2020 Mimura

FOREIGN PATENT DOCUMENTS

| WO | 2016208236 A1 | 12/2016 |
| WO | 2017073425 A1 | 5/2017 |
| WO | 2018198654 A1 | 11/2018 |

OTHER PUBLICATIONS

Written Opinion in PCT/JP2021/041208, mailed Jan. 25, 2022, 5 pages.

* cited by examiner

FILTER DEVICE

CROSS REFERENCE TO RELATED APPLICATIONS

This application claims the benefit of priority to Provisional Application No. 63/112,247 filed on Nov. 11, 2020 and is a Continuation Application of PCT Application No. PCT/JP2021/041208 filed on Nov. 9, 2021. The entire contents of each application are hereby incorporated herein by reference.

BACKGROUND OF THE INVENTION

1. Field of the Invention

The present invention relates to a filter device.

2. Description of the Related Art

Filter devices that include acoustic wave resonators have been widely used in mobile phones and the like. In recent years, an acoustic wave device, such as that described in U.S. Pat. No. 10,491,192, that uses bulk waves in a thickness shear mode has been proposed. In this acoustic wave device, a pair of electrodes are provided on a piezoelectric layer. The pair of electrodes face each other on the piezoelectric layer and are connected to different potentials. An alternating-current voltage is applied between the electrodes, thus exciting bulk waves in a thickness shear mode.

In an acoustic wave resonator that uses bulk waves in a thickness shear mode, when Y-cut $LiNbO_3$ is used as a piezoelectric layer, it is not always possible to obtain satisfactory resonance characteristics due to generation of a large spurious response. Therefore, filter characteristics may be deteriorated in a filter device as a whole.

SUMMARY OF THE INVENTION

Preferred embodiments of the present invention provide filter devices that are each able to reduce or prevent a spurious response.

A filter device according to a preferred embodiment of the present invention includes a first acoustic wave resonator, and a second acoustic wave resonator. Each of the first acoustic wave resonator and the second acoustic wave resonator includes a support, a piezoelectric layer on the support, an X-axis, a Y-axis, and a Z-axis that are crystal axes, is made of Y-cut lithium niobate, and an IDT electrode on the piezoelectric layer. An IDT electrode of each of the first acoustic wave resonator and the second acoustic wave resonator includes a first busbar and a second busbar that face each other, a plurality of first electrode fingers each connected at one end to the first busbar, and a plurality of second electrode fingers each connected at one end to the second busbar and interdigitated with the plurality of first electrode fingers. In each of the first acoustic wave resonator and the second acoustic wave resonator, d/p is less than or equal to about 0.5, where d is a thickness of the piezoelectric layer and p is a center-to-center distance of the first electrode fingers and the second electrode fingers adjacent to each other. When an imaginary line connecting tips of the plurality of first electrode fingers is an envelope in each of the first acoustic wave resonator and the second acoustic wave resonator, a direction in which the envelope extends and a direction of the X-axis intersect each other. An absolute value of a first slant angle $\alpha 1$ and an absolute value of a second slant angle $\alpha 2$ differ from each other, the first slant angle $\alpha 1$ being an angle of a corner defined by the direction in which the envelope extends and the direction of the X-axis and being an angle other than 0° in the first acoustic wave resonator, the second slant angle $\alpha 2$ being an angle of a corner defined by the direction in which the envelope extends and the direction of the X-axis and being an angle other than 0° in the second acoustic wave resonator.

With each of the filter devices according to preferred embodiments of the present invention, a spurious response is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

Preferred embodiments described in the present description are presented as examples, and components in different preferred embodiments can be partially replaced or combined together.

Figure 1:
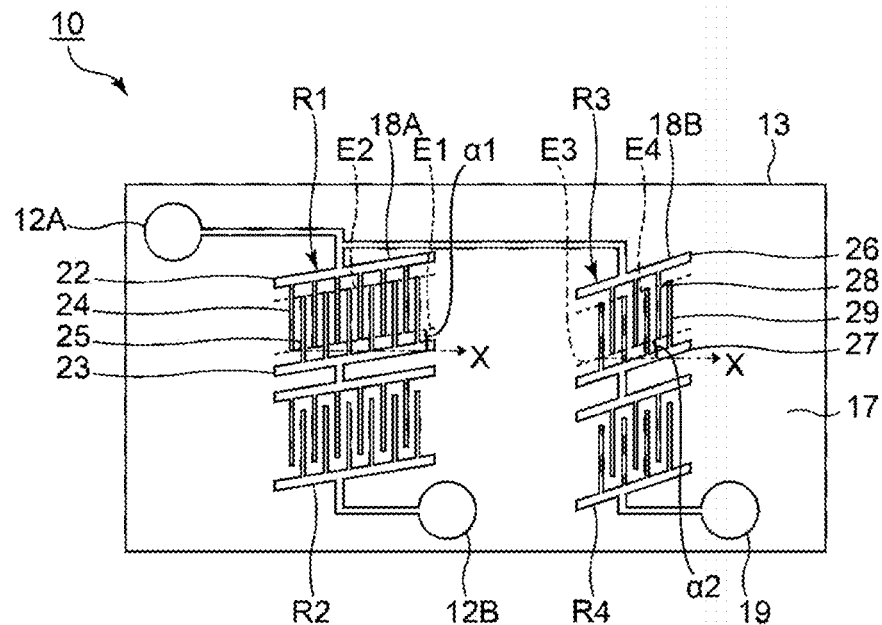
FIG. 1 is a schematic plan view of a filter device according to a first preferred embodiment of the present invention.

FIG. 1 is a schematic plan view of a filter device according to a first preferred embodiment of the present invention.

A filter device 10 includes a first signal end 12A, a second signal end 12B, a ground end 19, and a plurality of acoustic wave resonators. More specifically, the plurality of acoustic wave resonators of the filter device 10 are an acoustic wave resonator R1, an acoustic wave resonator R2, an acoustic wave resonator R3, and an acoustic wave resonator R4. The acoustic wave resonator R1 is a first acoustic wave resonator. The acoustic wave resonator R3 is a second acoustic wave resonator. The first signal end 12A is an antenna end. The antenna end is connected to an antenna.

In the filter device 10, the acoustic wave resonator R1 and the acoustic wave resonator R2 are connected in series to each other between the first signal end 12A and the second signal end 12B. The acoustic wave resonator R3 and the acoustic wave resonator R4 are connected in series to each other between the first signal end 12A and the ground end 19. In the present preferred embodiment, the acoustic wave resonator R1 as the first acoustic wave resonator is an acoustic wave resonator that is disposed closest to the first signal end 12A. The circuit configuration of the filter device 10 is not limited to that described above.

The pass band of the filter device 10 is n77. More specifically, the pass band of the filter device 10 is, for example, about 3400 MHz to about 4200 MHz. The pass band of the filter device 10 is, however, not limited to those described above. The filter device according to the present invention may be a transmission filter, may be a reception filter, or may be a composite filter device, such as a duplexer or a multiplexer.

The plurality of acoustic wave resonators share a piezoelectric substrate 13. The piezoelectric substrate 13 includes a piezoelectric layer 17. The piezoelectric layer 17 includes an X-axis, a Y-axis, and a Z-axis that are crystal axes. The piezoelectric layer 17 is made of, for example, Y-cut lithium niobate. In the present description, a certain member that is made of a certain material means that the member may include impurities of a minute amount of a degree with which the electrical characteristics of a filter device are not deteriorated. In the present preferred embodiment, the cut-angle of lithium niobate of the piezoelectric layer 17 is within a range of, for example, about 128°±10° Y-cut. The cut-angle of the lithium niobate of the piezoelectric layer 17 is, however, not limited to that described above.

The acoustic wave resonators each include an IDT electrode. The IDT electrodes are provided on the piezoelectric layer 17. In the present preferred embodiment, the IDT electrodes are structured as a laminated metal film including, for example, a Ti layer and an Al layer laminated on each other. The Ti layer is positioned closer than the Al layer to the piezoelectric layer 17. The materials of the IDT electrodes are, however, not limited to those described above. Alternatively, the IDT electrodes each may include a single layer of a metal film.

The IDT electrode of the acoustic wave resonator R1 as the first acoustic wave resonator is an IDT electrode 18A. The IDT electrode 18A includes a first busbar 22, a second busbar 23, a plurality of first electrode fingers 24, and a plurality of second electrode fingers 25. The plurality of first electrode fingers 24 are periodically disposed. Respective one ends of the plurality of first electrode fingers 24 are connected to the first busbar 22. The plurality of second electrode fingers 25 are periodically disposed. Respective one ends of the plurality of second electrode fingers 25 are connected to the second busbar 23. The plurality of first electrode fingers 24 and the plurality of second electrode fingers 25 are interdigitated with each other.

Hereinafter, the first electrode fingers 24 and the second electrode fingers 25 may simply be referred to as the electrode fingers. When a direction in which the electrode fingers adjacent to each other face each other is defined as an electrode-finger facing direction and a direction in which the plurality of electrode fingers extend is defined as an electrode-finger extending direction, the electrode-finger extending direction is orthogonal or substantially orthogonal to the electrode-finger facing direction in the IDT electrode 18A. Further, the electrode-finger extending direction is orthogonal or substantially orthogonal to the direction of the X-axis. The relationship among the electrode-finger extending direction, the electrode-finger facing direction, and the direction of the X-axis is, however, not limited to that described above.

The IDT electrode 18A is an inclined IDT electrode. More specifically, when an imaginary line connecting tips of the plurality of first electrode fingers 24 is defined as a first envelope E1, a direction in which the first envelope E1 extends intersects the direction of the X-axis. In FIG. 1, the direction of the X-axis is indicated by the arrow with a dashed double-dotted line. Similarly, when an imaginary line connecting tips of the plurality of second electrode fingers 25 is defined as a second envelope E2, a direction in which the second envelope E2 extends intersects the direction of the X-axis. In the present preferred embodiment, the first envelope E1 and the second envelope E2 are parallel or substantially parallel to each other. The relationship between the first envelope E1 and the second envelope E2 is, however, not limited to that described above.

Similarly, the acoustic wave resonators other than the acoustic wave resonator R1 each include an inclined IDT electrode. Each of the IDT electrodes also includes a first busbar, a second busbar, a plurality of first electrode fingers, and a plurality of second electrode fingers. Also in each of the IDT electrodes, imaginary lines as a first envelope and a second envelope can be provided. More specifically, the IDT electrode of the acoustic wave resonator R3 as the second acoustic wave resonator is an IDT electrode 18B. The IDT electrode 18B includes a first busbar 26, a second busbar 27, a plurality of first electrode fingers 28, and a plurality of second electrode fingers 29. The electrode-finger extending direction in the acoustic wave resonator R3 is also orthogonal or substantially orthogonal to the electrode-finger facing direction and the direction of the X-axis. In the present preferred embodiment, a first envelope E3 and a second envelope E4 of the IDT electrode 18B are parallel or substantially parallel to each other. The relationship among the electrode-finger extending direction, the electrode-finger facing direction, and the direction of the X-axis and the relationship between the first envelope E3 and the second envelope E4 are, however, not limited to those described above.

An angle of a corner defined by the direction in which the first envelope extends and the direction of the X-axis in an acoustic wave resonator is defined as a slant angle. In particular, in the first acoustic wave resonator, an angle of a corner defined by the direction in which the first envelope E1 extends and the direction of the X-axis and that is an angle other than 0° is defined as a first slant angle α1. In the second acoustic wave resonator, an angle of a corner defined by the direction in which the first envelope E3 extends and the direction of the X-axis and that is an angle other than 0° is defined as a second slant angle α2. In the filter device 10, the slant angle of the IDT electrode of the acoustic wave resonator R2 is the same or substantially the same as the first slant angle α1. The slant angle of the IDT electrode of the acoustic wave resonator R4 is the same or substantially the same the second slant angle α2. The configurations of the acoustic wave resonator R2 and the acoustic wave resonator R4 are, however, not limited to those described above. For example, the first envelope and the second envelope in the IDT electrode of each of the acoustic wave resonator R2 and the acoustic wave resonator R4 may be parallel or substantially parallel to the X-axis.

Figure 2:
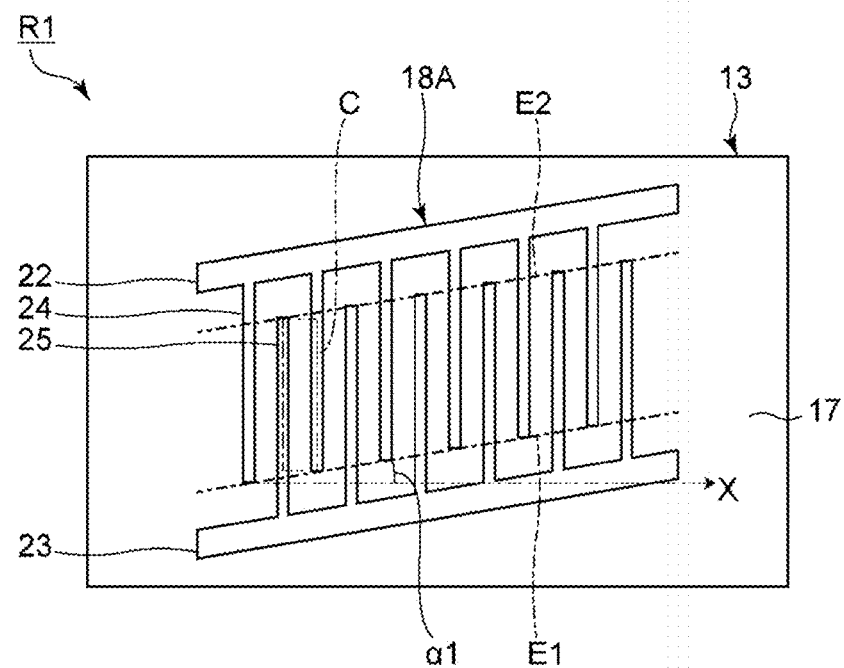
FIG. 2 is a schematic plan view of a first acoustic wave resonator in the first preferred embodiment of the present invention.

FIG. 2 is a schematic plan view of the first acoustic wave resonator in the first preferred embodiment.

In the IDT electrode 18A, a region in which electrode fingers adjacent to each other overlap each other when viewed in the electrode-finger facing direction is an intersection region. The acoustic wave resonator R1 includes a plurality of excitation regions C. Similarly to the intersection region, the excitation regions C are regions in each of which electrode fingers adjacent to each other overlap each other when viewed in the electrode-finger facing direction. The excitation regions C are each a region between a pair of electrode fingers. In more detail, each of the excitation regions C is a region from the center of one of the electrode fingers in the electrode-finger facing direction to the center of the other of the electrode fingers in the electrode-finger facing direction. The intersection region thus includes the plurality of excitation regions C. By applying an alternating-current voltage to the IDT electrode 18A, acoustic waves are excited in the plurality of excitation regions C. In the present preferred embodiment, the acoustic wave resonator R1 is configured to be able to use bulk waves in a thickness shear mode such as, for example, a thickness shear primary mode. Each of the other acoustic wave resonators similarly includes an intersection region and a plurality of excitation regions.

In each of the plurality of acoustic wave resonators, when a thickness of the piezoelectric layer 17 is d and a center-to-center distance of the first electrode fingers and the second electrode fingers adjacent to each other is p, d/p is, for example, less than or equal to about 0.5. Consequently, bulk waves in a thickness shear mode are suitably excited. The piezoelectric substrate 13 is a multilayer body, which will be described later in detail, including a support, an electrically insulating layer, and the piezoelectric layer 17. The electrically insulating layer is provided on the support. The piezoelectric layer 17 is provided on the electrically insulating layer. The piezoelectric layer 17, however, may be provided directly on the support. As illustrated in FIG. 1, the plurality of acoustic wave resonators share the same support, the same electrically insulating layer, and the same piezoelectric layer 17. The plurality of acoustic wave resonators, however, may each include a separate support, a separate electrically insulating layer, and a separate piezoelectric layer. For example, in at least one of the first acoustic wave resonator and the second acoustic wave resonator, the cut-angle of lithium niobate used in the piezoelectric layer may be, for example, within the range of about 128°±10° Y-cut.

A feature of the present preferred embodiment is that the absolute value |α1| of the first slant angle α1 and the absolute value |α2| of the second slant angle α2 differ from each other. Consequently, a spurious response can be reduced or prevented. Details of this will be described below.

Resonance characteristics were evaluated every time when the slant angle α of the acoustic wave resonator was changed. More specifically, the slant angle α was changed in increments of about 2° in the range from about 0° to about 40°. The design parameters of the acoustic wave resonator were set as follows. The electrode finger pitch described below is a center-to-center distance of electrode fingers adjacent to each other. A distance between tips of electrode fingers and a busbar is defined as an I-B gap. A dimension of the intersection region in the electrode-finger extending direction is defined as an intersection width. The width of an electrode finger is a dimension of the electrode finger in the electrode-finger facing direction.

The layer configuration of the IDT electrode: materials of layers . . . Ti/Al from the piezoelectric layer side, the thickness of each layer . . . about 0.05 μm/about 0.6 μm from the piezoelectric layer side,
  the electrode finger pitch: about 3.96 μm,
  the I-B gap: about 3.96 μm,
  the intersection width: about 57.88 μm,
  the width of each electrode finger: about 1.2 μm,
  the number of pairs of the electrode fingers: 100 pairs,
  the Euler angles (ϕ, θ, ψ) of the piezoelectric layer: (about 0°, about 38°, about 0°), and
  the thickness of the piezoelectric layer: about 0.5 μm.

Figure 3:
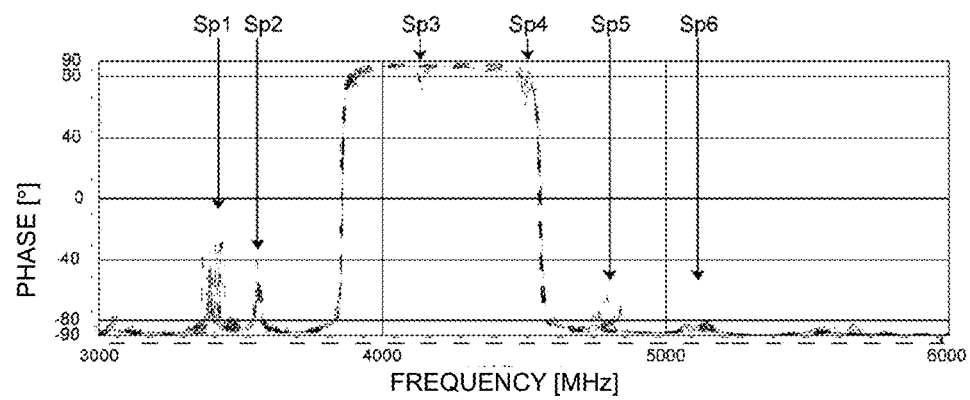
FIG. 3 is a graph showing a relationship between a slant angle $\alpha$ in an acoustic wave resonator and phase characteristics. The vicinity of frequencies at which a spurious response is generated is illustrated.
Figure 4:
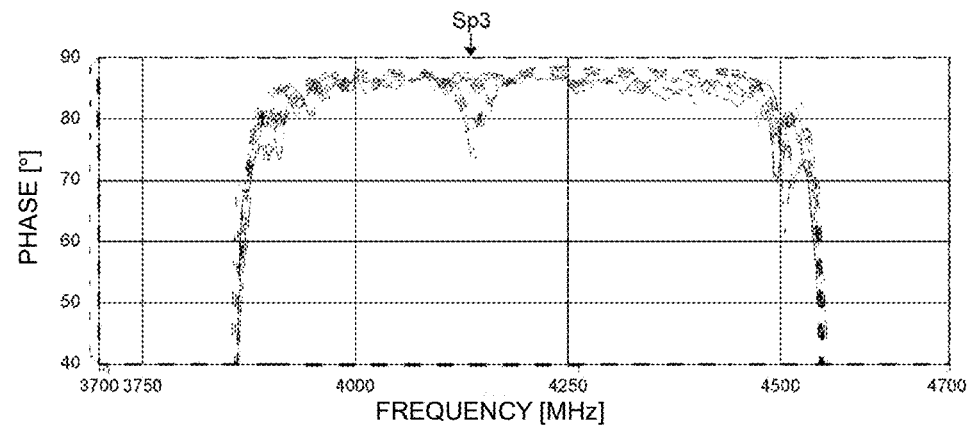
FIG. 4 is an enlarged view of FIG. 3.

FIG. 3 is a graph showing a relationship between the slant angle α in an acoustic wave resonator and phase characteristics. FIG. 4 is an enlarged view of FIG. 3.

As shown in FIG. 3, a spurious response Sp1, a spurious response Sp2, a spurious response Sp3, a spurious response Sp4, a spurious response Sp5, and a spurious response Sp6 are generated in the acoustic wave resonator. As shown in FIG. 3 and FIG. 4, when the slant angle α varies, frequencies at which each spurious is generated and the phase also vary. Regarding the above, the spurious response Sp1 will be described in more detail with reference to FIG. 5 and FIG. 6.

Figure 5:
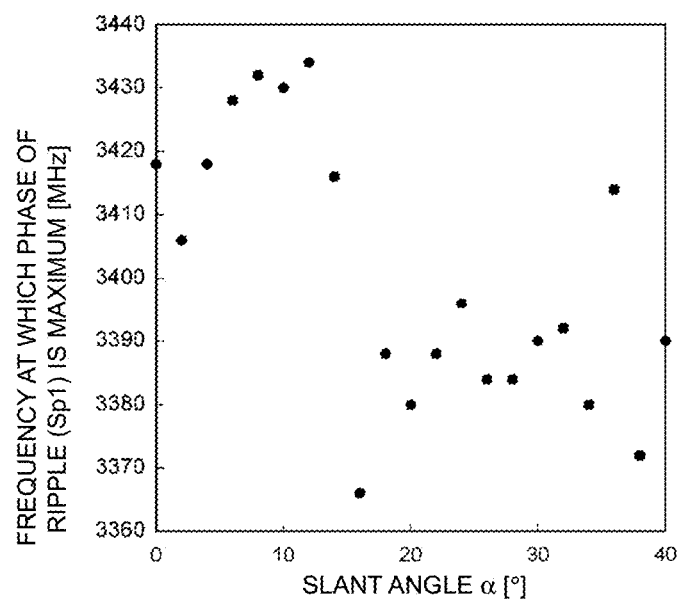
FIG. 5 is a graph showing a relationship between a slant angle $\alpha$ in an acoustic wave resonator and frequencies at which the phase of a ripple generated by a spurious response Sp1 is the maximum.
Figure 6:
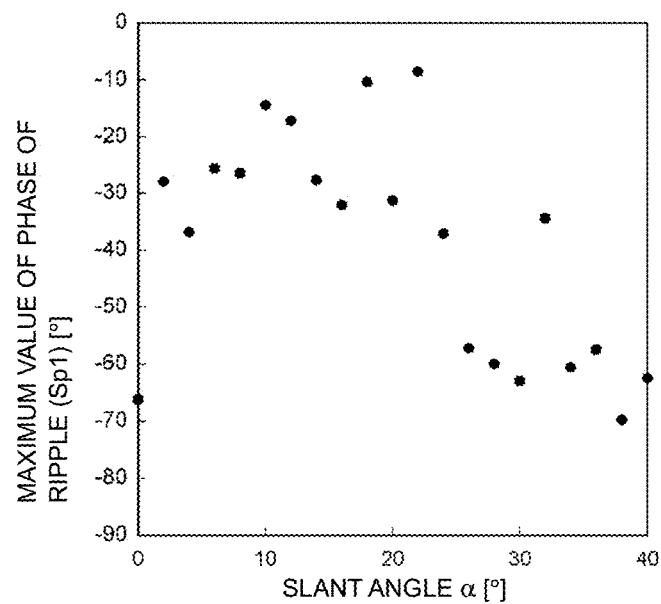
FIG. 6 is a graph showing a relationship between a slant angle $\alpha$ in an acoustic wave resonator and the maximum value of the phase of a ripple generated by the spurious response Sp1.

FIG. 5 is a graph showing a relationship between the slant angle α in the acoustic wave resonator and frequencies at which the phase of a ripple generated by the spurious response Sp1 is the maximum. FIG. 6 is a graph showing a relationship between the slant angle α in the acoustic wave resonator and the maximum value of the phase of a ripple generated by the spurious response Sp1.

As shown in FIG. 5, when the slant angle α varies in the acoustic wave resonator, a frequency at which the phase of the spurious response Sp1 is the maximum varies. In addition, as shown in FIG. 6, when the slant angle α varies, the maximum value of the phase of the spurious response Sp1 also varies. Here, in the first preferred embodiment, the absolute value |α1| of the first slant angle α1 and the absolute value |α2| of the second slant angle α2 differ from each other. Therefore, it is possible to disperse the frequency at which the phase of the ripple generated by the spurious response Sp1 and the maximum value of the phase of the ripple generated by the spurious response Sp1. The same applies to the other spurious responses. Accordingly, a spurious response can be reduced or prevented in the filter device 10 as a whole.

Figure 7:
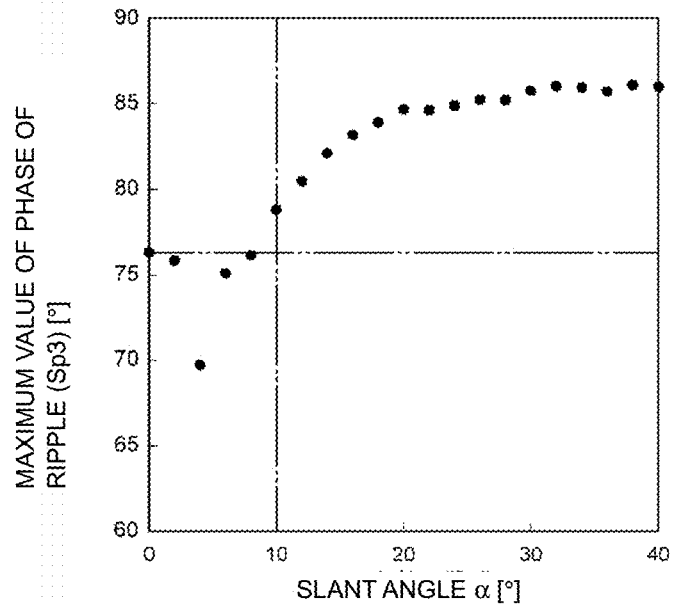
FIG. 7 is a graph showing a relationship between a slant angle $\alpha$ in an acoustic wave resonator and the maximum value of the phase of a ripple generated by a spurious response Sp3.

FIG. 7 is a graph showing a relationship between the slant angle α in an acoustic wave resonator and the maximum value of the phase of a ripple generated by the spurious response Sp3.

As shown in FIG. 7, the slant angle α and the maximum value of the phase of the ripple generated by the spurious response Sp3 have a correlation. More specifically, when the slant angle α is more than or equal to about 4°, the maximum value of the phase of the ripple increases as the slant angle α increases. The spurious response Sp3 is generated in a pass band. In this case, the larger the value of the phase of a ripple generated by the spurious response Sp3, the more the ripple can be reduced or prevented. As shown in FIG. 7, when the slant angle α is more than or equal to about 10°, the maximum value of the phase of a ripple generated by the spurious response Sp3 can be increased more than when the slant angle α is about 0°. It is thus preferable that the absolute value of at least one of the first slant angle α1 and the second slant angle α2 is more than or equal to about 10°. Consequently, a ripple in a pass band can be effectively reduced or prevented.

In the first preferred embodiment, all of the IDT electrodes of the plurality of acoustic wave resonators are inclined IDT electrodes. The IDT electrodes of acoustic wave resonators other than the first acoustic wave resonator and the second acoustic wave resonator, however, may be regular IDT electrodes. In the regular IDT electrodes in the present description, the electrode-finger facing direction, the direction in which the first envelope extends, and the direction in which the second envelope extends are parallel or substantially parallel to each other.

A second preferred embodiment and a third preferred embodiment of the present invention will be described below as examples that differ from the first preferred embodiment in terms of the circuit configuration and the arrangement of the first acoustic wave resonator and the second acoustic wave resonator.

Figure 8:
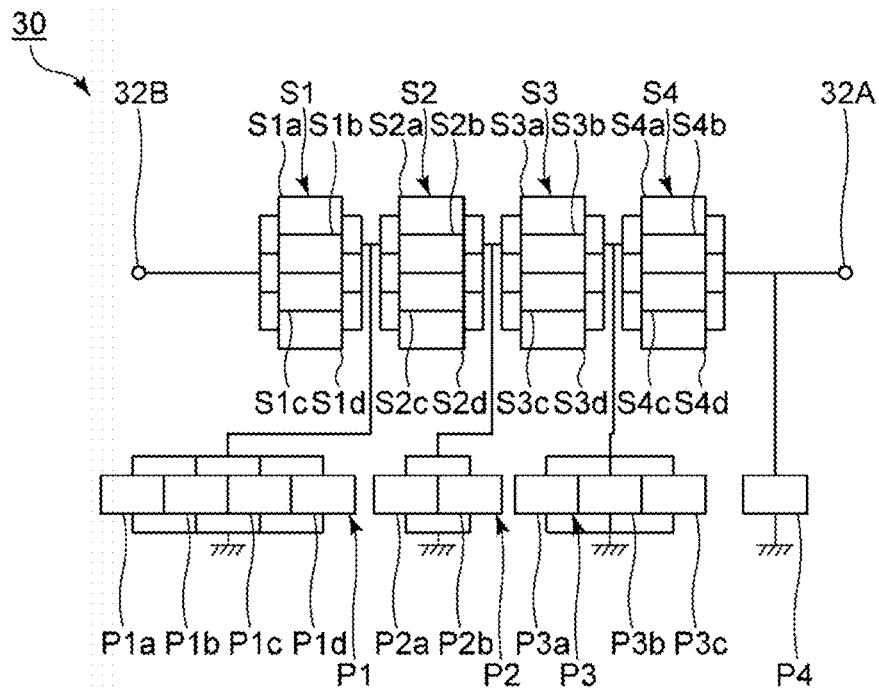
FIG. 8 is a schematic circuit diagram of a filter device according to a second preferred embodiment of the present invention.

FIG. 8 is a schematic circuit diagram of a filter device according to the second preferred embodiment.

A filter device 30 in the present preferred embodiment is, for example, a ladder filter. The filter device 30 includes a first signal end 32A, a second signal end 32B, a plurality of series arm resonators, and a plurality of parallel arm resonators. The plurality of series arm resonators include a plurality of divided resonators. Similarly, the plurality of parallel arm resonators also include a plurality of divided resonators. Each of the divided resonators is a resonator in which one resonator is divided in series or divided in parallel. In the present preferred embodiment, all of the plurality of divided resonators are resonators divided in parallel. The plurality of divided resonators, however, may include resonators divided in series. All of the resonators of the filter device 30 are acoustic wave resonators.

In the filter device 30, the first signal end 32A is an antenna end. The second signal end 32B is an input end. For example, the first signal end 32A and the second signal end 32B may be structured as electrode pads or may be structured as wires.

When a group of a plurality of divided resonators in which the same series arm resonators are divided is defined as a series-arm-resonator group, the filter device 30 includes a series-arm-resonator group S1, a series-arm-resonator group S2, a series-arm-resonator group S3, and a series-arm-resonator group S4. The series-arm-resonator group S1, the series-arm-resonator group S2, the series-arm-resonator group S3, and the series-arm-resonator group S4 are connected in series to each other between the first signal end 32A and the second signal end 32B. The series-arm-resonator group S1 includes, as a plurality of the divided resonators, a series arm resonator S1a, a series arm resonator S1b, a series arm resonator S1c, and a series arm resonator S1d. The series-arm-resonator group S2 includes, as a plurality of the divided resonators, a series arm resonator S2a, a series arm resonator S2b, a series arm resonator S2c, and a series arm resonator S2d. The series-arm-resonator group S3 includes, as a plurality of the divided resonators, a series arm resonator S3a, a series arm resonator S3b, a series arm resonator S3c, and a series arm resonator S3d. The series-arm-resonator group S4 includes, as a plurality of the divided resonators, a series arm resonator S4a, a series arm resonator S4b, a series arm resonator S4c, and a series arm resonator S4d.

When a group of the plurality of divided resonators in which the same parallel arm resonators are divided is defined as a parallel-arm-resonator group, the filter device 30 includes a parallel-arm-resonator group P1, a parallel-arm-resonator group P2, a parallel-arm-resonator group P3, and a parallel arm resonator P4. The parallel-arm-resonator group P1 is connected between a ground potential and a connection point between the series-arm-resonator group S1 and the series-arm-resonator group S2. The parallel-arm-resonator group P2 is connected between a ground potential and a connection point between the series-arm-resonator group S2 and the series-arm-resonator group S3. The parallel-arm-resonator group P3 is connected between a ground potential and a connection point between the series-arm-resonator group S3 and the series-arm-resonator group S4. The parallel arm resonator P4 is connected between the first signal end 32A and a ground potential.

The parallel-arm-resonator group P1 includes, as a plurality of the divided resonators, a parallel arm resonator P1a, a parallel arm resonator P1b, a parallel arm resonator P1c, and a parallel arm resonator P1d. The parallel-arm-resonator group P2 includes, as a plurality of the divided resonators, a parallel arm resonator P2a and a parallel arm resonator P2b. The parallel-arm-resonator group P3 includes, as a plurality of the divided resonators, a parallel arm resonator P3a, a parallel arm resonator P3b, and a parallel arm resonator P3c.

In the present preferred embodiment, the series-arm-resonator groups and the parallel-arm-resonator groups each include a first acoustic wave resonator and a second acoustic wave resonator. Specifically, the first acoustic wave resonator of the series-arm-resonator group S1 is the series arm resonator S1b. The second acoustic wave resonator of the series-arm-resonator group S1 is the series arm resonator S1c. The series-arm-resonator group S1 includes acoustic wave resonators other than the first acoustic wave resonator and the second acoustic wave resonator. More specifically, the acoustic wave resonators are the series arm resonator S1a and the series arm resonator S1d.

When the slant angle of the series arm resonator S1a is $\alpha_{\_S1a}$, the slant angle of the series arm resonator S1b is a $\alpha_{\_S1b}$, the slant angle of the series arm resonator S1c is $\alpha_{\_S1c}$, and the slant angle of the series arm resonator S1d is $\alpha_{\_S1d}$, the slant angle $\alpha_{\_S1a}$ is, for example, about 5°. The slant angle $\alpha_{\_S1b}$ is, for example, about 10°. The slant angle $\alpha_{\_S1c}$ is, for example, about 15°. The slant angle $\alpha_{\_S1d}$ is, for example, about 20°. Therefore, the absolute value of the slant angle $\alpha_{\_S1b}$ as the first slant angle $\alpha 1$ and the absolute value of the slant angle $\alpha_{\_S1c}$ as the second slant angle $\alpha 2$ differ from each other. In addition, the absolute value of the slant angle $\alpha$ of each of the resonators other than the first acoustic wave resonator and the second acoustic wave resonator also differs from the absolute values of the first slant angle $\alpha 1$ and the second slant angle $\alpha 2$. It is, however, sufficient that at least the absolute value of the slant angle $\alpha_{\_S1b}$ as the first slant angle $\alpha 1$ and the absolute value of the slant angle $\alpha_{\_S1c}$ as the second slant angle $\alpha 2$ differ from each other.

Meanwhile, the first acoustic wave resonator of the parallel-arm-resonator group P1 is the parallel arm resonator P1b. The second acoustic wave resonator of the parallel-arm-resonator group P1 is the parallel arm resonator P1c. The parallel-arm-resonator group P1 includes acoustic wave resonators other than the first acoustic wave resonator and the second acoustic wave resonator. More specifically, the acoustic wave resonators are parallel arm resonator P1a and the parallel arm resonator P1d.

When the slant angle of the parallel arm resonator P1a is a p1a, the slant angle of the parallel arm resonator P1b is $\alpha_{\_P1b}$, the slant angle of the parallel arm resonator P1c is $\alpha_{\_P1c}$, and the slant angle of the parallel arm resonator P1d is $\alpha_{\_P1d}$, the slant angle $\alpha_{\_P1a}$ is, for example, about 0°. The slant angle $\alpha_{\_P1b}$ is, for example, about 10°. The slant angle $\alpha_{\_P1c}$ is, for example, about 20°. The slant angle $\alpha_{\_P1d}$ is, for example, about 30°. Therefore, the absolute value of the slant angle $\alpha_{\_P1b}$ as the first slant angle $\alpha 1$ and the absolute value of the slant angle $\alpha_{\_P1c}$ as the second slant angle $\alpha 2$ differ from each other. In addition, the absolute value of the slant angle $\alpha$ of each of the acoustic wave resonators other than the first acoustic wave resonator and the second acoustic wave resonator also differs from the absolute values of the first slant angle $\alpha 1$ and the second slant angle $\alpha 2$. It is, however, sufficient that at least the absolute value of the slant angle $\alpha_{\_P1b}$ as the first slant angle $\alpha 1$ and the absolute value of the slant angle $\alpha_{\_P1c}$ as the second slant angle $\alpha 2$ differ from each other.

The series-arm-resonator groups and the parallel-arm-resonator groups other than the series-arm-resonator group S1 and the parallel-arm-resonator group P1 also each include a first acoustic wave resonator and a second acoustic wave resonator. In the series-arm-resonator groups and the parallel-arm-resonator groups, the absolute value of the first slant angle $\alpha 1$ and the absolute value of the second slant angle $\alpha 2$ differ from each other. Consequently, it is possible to disperse a spurious response and to reduce or prevent a spurious response in the filter device 30 as a whole.

It is sufficient for the filter device 30 to include at least one first acoustic wave resonator and at least one second acoustic wave resonator. As in the present preferred embodiment, at least one acoustic wave resonator other than the first acoustic wave resonator and the second acoustic wave resonator may be included. As described above, the absolute value of the slant angle $\alpha$ of the at least one acoustic wave resonator may differ from the absolute value of the first slant angle $\alpha 1$ and the absolute value of the second slant angle $\alpha 2$. Further, the absolute value of the slant angle $\alpha$ may be different among a plurality of the acoustic wave resonators other than the first acoustic wave resonator and the second acoustic wave resonator.

The circuit configuration in the third preferred embodiment described below is the same or substantially the same as the circuit configuration in the second preferred embodiment. Therefore, the third preferred embodiment will be described with reference to the drawings and the signs with which the second preferred embodiment has been described.

The third preferred embodiment differs from the second preferred embodiment in the arrangement of the first acoustic wave resonator and the second acoustic wave resonator. Regarding features other than the above feature, the filter device in the third preferred embodiment has a configuration the same as or similar to that of the filter device 30 in the second preferred embodiment.

In the third preferred embodiment, one of the plurality of series-arm-resonator groups includes the first acoustic wave resonator, and another one of the plurality of series-arm-resonator groups includes the second acoustic wave resonator. In addition, one of the plurality of parallel-arm-resonator groups includes the first acoustic wave resonator, and another one of the plurality of parallel-arm-resonator groups includes the second acoustic wave resonator.

Specifically, in the plurality of series-arm-resonator groups, the first acoustic wave resonator is the series arm resonator S2a. The second acoustic wave resonator is the series arm resonator S3a. When the slant angle of the series arm resonator S1a is $\alpha_{\_S1a}$, the slant angle of the series arm resonator S2a is $\alpha_{\_S2a}$, the slant angle of the series arm resonator S3a is $\alpha_{\_S3a}$, and the slant angle of the series arm resonator S4a is $\alpha_{\_S4a}$, the slant angle $\alpha_{\_S1a}$ is, for example, about 5°. The slant angle $\alpha_{\_S2a}$ is, for example, about 10°. The slant angle $\alpha_{\_S3a}$ is, for example, about 15°. The slant angle $\alpha_{\_S4a}$ is, for example, about 20°. Therefore, the absolute value of the slant angle $\alpha_{\_S2a}$ as the first slant angle $\alpha 1$ and the absolute value of the slant angle $\alpha_{\_S3a}$ as the second slant angle $\alpha 2$ differ from each other. In addition, the absolute value of the slant angle $\alpha$ of each of the acoustic wave resonators other than the first acoustic wave resonator and the second acoustic wave resonator also differs from the absolute values of the first slant angle $\alpha 1$ and the second slant angle $\alpha 2$. It is, however, sufficient that at least the absolute value of the slant angle $\alpha_{\_S2a}$ as the first slant angle $\alpha 1$ and the absolute value of the slant angle $\alpha_{\_S3a}$ as the second slant angle $\alpha 2$ differ from each other. For example, the slant angles $\alpha$ of all of the series arm resonators in the same series-arm-resonator group may be the same.

Meanwhile, in the plurality of parallel-arm-resonator groups, the first acoustic wave resonator is the parallel arm resonator P2a. The second acoustic wave resonator is the parallel arm resonator P3a. When the slant angle of the parallel arm resonator P1a is $\alpha_{\_P1a}$, the slant angle of the parallel arm resonator P2a is $\alpha_{\_P2a}$, the slant angle of the parallel arm resonator P3a is $\alpha_{\_P3a}$, and the slant angle of a parallel arm resonator P4a is $\alpha_{\_P4a}$, the slant angle $\alpha_{\_P1a}$ is, for example, about 0°. The slant angle $\alpha_{\_P2a}$ is, for example, about 10°. The slant angle $\alpha_{\_P3a}$ is, for example, about 20°. The slant angle $\alpha_{\_P4a}$ is, for example, about 40°. Therefore, the absolute value of the slant angle $\alpha_{\_P2a}$ as the first slant angle $\alpha 1$ and the absolute value of the slant angle $\alpha_{\_P1a}$ as the second slant angle $\alpha 2$ differ from each other. In addition, the absolute value of the slant angle $\alpha$ of each of the acoustic wave resonators other than the first acoustic wave resonator and the second acoustic wave resonator also differs from the absolute values of the first slant angle α1 and the second slant angle α2. It is, however, sufficient that at least the absolute value of the slant angle $\alpha_{\_P2a}$ as the first slant angle α1 and the absolute value of the slant angle $\alpha_{\_P3a}$ as the second slant angle α2 differ from each other. For example, the slant angles α of all of the parallel arm resonators in the same parallel-arm-resonator group may be the same.

Similarly to the second preferred embodiment, it is also possible in the third preferred embodiment to disperse a spurious response and to reduce or prevent a spurious response in the filter device as a whole.

As in the third preferred embodiment, at least one acoustic wave resonator other than the first acoustic wave resonator and the second acoustic wave resonator may be included. As described above, the absolute value of the slant angle α of the at least one acoustic wave resonator may differ from the absolute value of the first slant angle α1 and the absolute value of the second slant angle α2. Further, the absolute value of the slant angle α may be different among a plurality of the acoustic wave resonators other than the first acoustic wave resonator and the second acoustic wave resonator.

With a regular IDT electrode used as an example, details of an acoustic wave device that uses bulk waves in a thickness shear mode will be described below. An acoustic wave device is synonymous with an acoustic wave resonator in the following description. The piezoelectric substrates of the acoustic wave resonators in the first to third preferred embodiments are each a multilayer body including a support, an electrically insulating layer, and a piezoelectric layer. The piezoelectric layer, however, may be provided directly on the support.

Figure 9A:
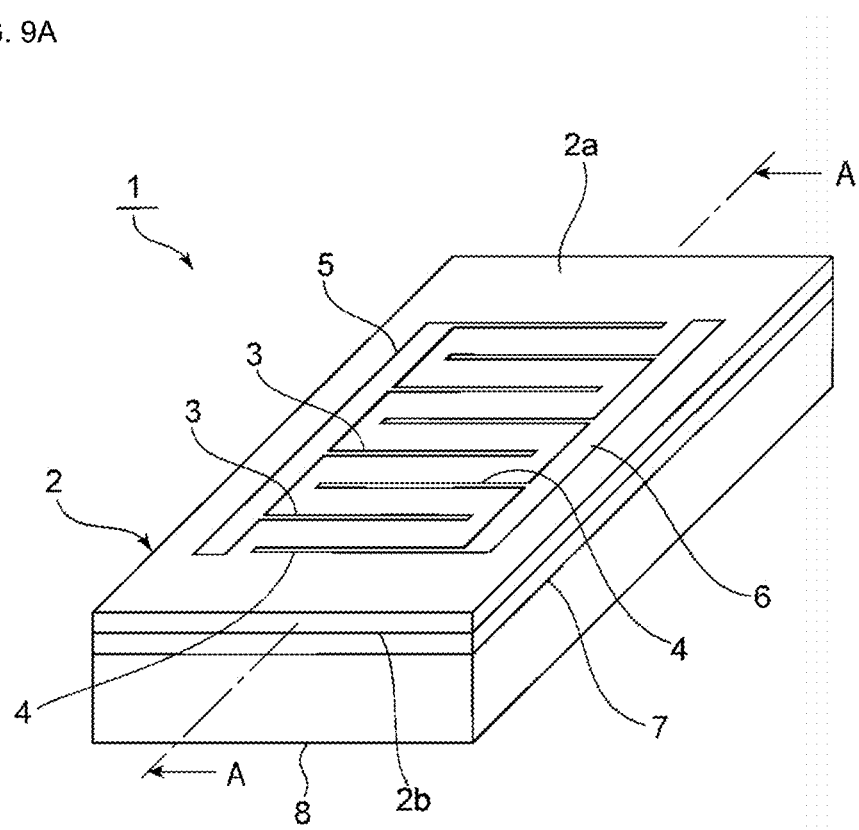
FIG. 9A is a schematic perspective view illustrating a filter device that uses bulk waves in a thickness shear mode.
Figure 9B:
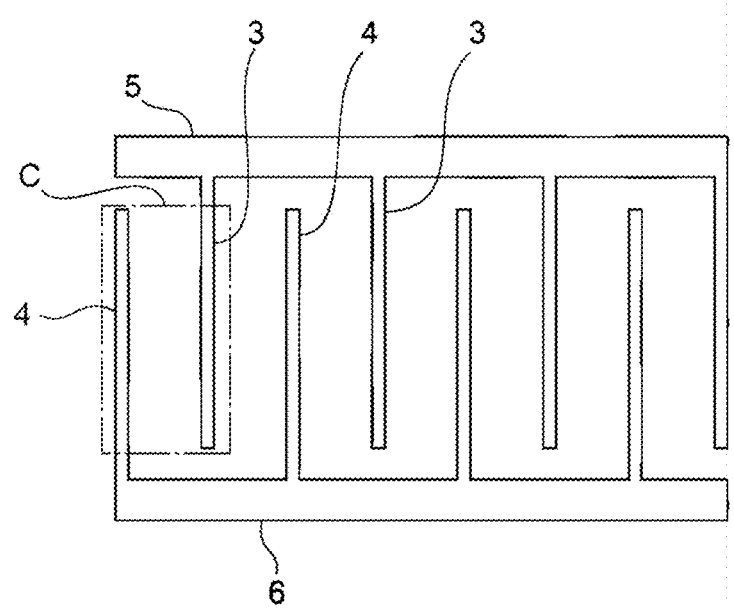
FIG. 9B is a plan view illustrating an electrode structure on a piezoelectric layer.
Figure 10:
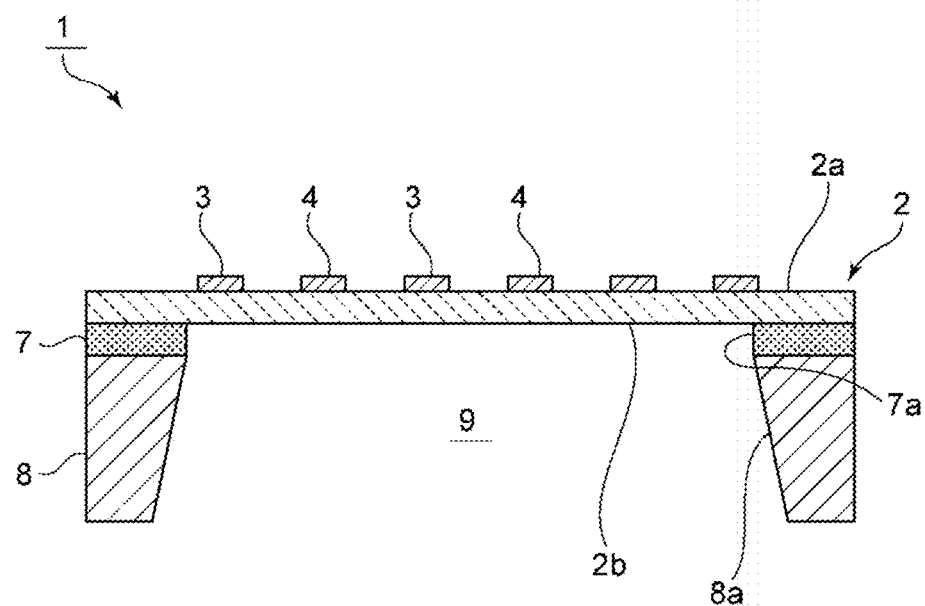
FIG. 10 is a sectional view of a portion along line A-A in FIG. 9A.

FIG. 9A is a schematic perspective view illustrating an appearance of an acoustic wave device that uses bulk waves in a thickness shear mode, FIG. 9B is a plan view illustrating an electrode structure on the piezoelectric layer, and FIG. 10 is a sectional view of a portion along line A-A in FIG. 9A.

An acoustic wave device 1 includes a piezoelectric layer 2 made of, for example, $LiNbO_3$. The cut-angle of $LiNbO_3$ is Z-cut but may be Y-cut or X-cut. The thickness of the piezoelectric layer 2 is not particularly limited but is preferably, for example, more than or equal to about 40 nm and less than or equal to about 1000 nm and more preferably more than or equal to about 50 nm and less than or equal to about 1000 nm to excite the thickness shear mode effectively. The piezoelectric layer 2 includes a first main surface 2a and a second main surface 2b that face each other. An electrode 3 and an electrode 4 are provided on the first main surface 2a. Here, the electrode 3 is one example of the "first electrode", and the electrode 4 is one example of the "second electrode". In FIGS. 9A and FIG. 9B, a plurality of the electrodes 3 are connected to a first busbar 5. A plurality of the electrodes 4 are connected to a second busbar 6. The plurality of electrodes 3 and the plurality of electrodes 4 are interdigitated with each other. The electrode 3 and the electrode 4 each have a rectangular or substantially rectangular shape and have a length direction. In a direction orthogonal or substantially orthogonal to this length direction, the electrode 3 and the electrode 4 adjacent thereto face each other. The plurality of electrodes 3 and 4, the first busbar 5, and the second busbar 6 define an IDT (Interdigital Transducer) electrode. The length directions of the electrodes 3 and 4 and a direction orthogonal or substantially orthogonal to the length directions of the electrodes 3 and 4 are each a direction intersecting the thickness direction of the piezoelectric layer 2. Therefore, it can be said that the electrode 3 and the electrode 4 adjacent thereto face each other in the direction intersecting the thickness direction of the piezoelectric layer 2. The length directions of the electrodes 3 and 4 may be replaced with a direction orthogonal or substantially orthogonal to the length directions of the electrodes 3 and 4 illustrated in FIGS. 9A and 9B. In other words, in FIGS. 9A and 9B, the electrodes 3 and 4 may extend in the direction in which the first busbar 5 and the second busbar 6 extend. In this case, the first busbar 5 and the second busbar 6 extend in the direction in which the electrodes 3 and 4 extend in FIGS. 9A and 9B. Then, a plurality of pairs of a structure in each of which the electrode 3 connected to one potential and the electrode 4 connected to the other potential are adjacent to each other are provided in the direction orthogonal or substantially orthogonal to the length directions of the electrodes 3 and 4. Here, the electrode 3 and the electrode 4 that are adjacent to each other do not denote that the electrode 3 and the electrode 4 are disposed in direct contact with each other but denote that the electrode 3 and the electrode 4 are disposed with a gap interposed therebetween. When the electrode 3 and the electrode 4 are adjacent to each other, electrodes, including the other electrodes 3 and 4, connected to a hot electrode and a ground electrode are not disposed between the electrode 3 and the electrode 4. The number of the pairs is not necessarily an integer number and may be 1.5 or 2.5. A center-to-center distance, that is, a pitch between the electrode 3 and the electrode 4 is preferably, for example, within the range from about 1 µm to about 10 µm. The width of each of the electrodes 3 and 4, that is, the dimension thereof in the facing direction of the electrodes 3 and 4 is preferably, for example, within the range from about 50 nm to about 1000 nm and more preferably within the range from about 150 nm to about 1000 nm. The center-to-center distance between the electrodes 3 and 4 is a distance that connects the center of the dimension (width dimension) of the electrode 3 in a direction orthogonal or substantially orthogonal to the length direction of the electrode 3 and the center of a dimension (width dimension) of the electrode 4 in a direction orthogonal or substantially orthogonal to the length direction of the electrode 4 to each other.

In the acoustic wave device 1, a Z-cut piezoelectric layer is used, and thus, the directions orthogonal or substantially orthogonal to the length directions of the electrode 3 or 4 are directions orthogonal or substantially orthogonal to a polarization direction of the piezoelectric layer 2. The above is not applicable to a case where a piezoelectric body of the other cut-angle is used as the piezoelectric layer 2. Here, "orthogonal" is not limited only to exactly orthogonal and may be substantially orthogonal (an angle formed by the direction orthogonal to the length direction of the electrode 3 or 4 and the polarization direction may be, for example, in the range of about 90°±10°).

A support 8 is laminated on the side of the second main surface 2b of the piezoelectric layer 2 with an electrically insulating layer 7 interposed therebetween. The electrically insulating layer 7 and the support 8 each have a frame shape and, as illustrated in FIG. 10, include an opening portions 7a and 8a, respectively. Consequently, a cavity portion 9 is provided. The cavity portion 9 is provided so that vibration of the excitation regions C of the piezoelectric layer 2 is not obstructed. Accordingly, the support 8 is laminated on the second main surface 2b with the electrically insulating layer 7 interposed therebetween at a position not overlapping a portion at which at least a pair of the electrodes 3 and 4 is provided. The electrically insulating layer 7 is not necessarily provided. Accordingly, the support 8 is laminated on the second main surface 2b of the piezoelectric layer 2 directly or indirectly. The electrically insulating layer 7 is made of, for example, silicon oxide. However, an appropriate electrically insulative material, other than silicon oxide, such as, for example, silicon nitride or alumina is usable. The support 8 is made of, for example, Si. The orientation of Si at a surface on the piezoelectric layer 2 side may be (100) or (110) and may be (111). Preferably, the Si of the support 8 is highly resistive with a resistivity of, for example, more than or equal to about 4 kΩ. The support 8, however, also may be made of an appropriate electrically insulating material or an appropriate semiconductor material.

Examples of materials usable as the material of the support 8 are a piezoelectric body, such as aluminum oxide, lithium tantalate, lithium niobate, or quartz, various types of ceramic materials, such as alumina, magnesia, sapphire, silicon nitride, aluminum nitride, silicon carbide, zirconia, cordierite, mullite, steatite, or forsterite, a dielectric, such as diamond or glass, a semiconductor, such as gallium nitride, and the like.

The plurality of electrodes 3 and 4 and the first and second busbars 5 and 6 are each made of an appropriate metal or an appropriate alloy, such as, for example, Al or an AlCu alloy. In the present preferred embodiment, the electrodes 3 and 4, and the first and second busbars 5 and 6 each have a structure including an Al film laminated on a Ti film. A close-contact layer other than the Ti film may be used.

An alternating-current voltage is applied between the plurality of electrodes 3 and the plurality of electrodes 4 to perform driving the acoustic wave device 1. More specifically, the alternating-current voltage is applied between the first busbar 5 and the second busbar 6. Consequently, it is possible to obtain resonance characteristics by using bulk waves in a thickness shear mode excited in the piezoelectric layer 2. In addition, in the acoustic wave device 1, when the thickness of the piezoelectric layer 2 is d and the center-to-center distance of, among the plurality of electrodes 3 and 4, electrodes 3 and 4 adjacent to each other is p, d/p is, for example, less than or equal to about 0.5. Therefore, bulk waves in the thickness shear mode are effectively excited, and satisfactory resonance characteristics can be obtained. More preferably, d/p is, for example, less than or equal to about 0.24. In this case, more satisfactory resonance characteristics can be obtained.

In the acoustic wave device 1, due to having the above-described configuration, the Q-value is unlikely to decrease, even when the number of pairs of the electrodes 3 and 4 is reduced to downsize the acoustic wave device 1. This is because, propagation loss is small even when the number of the electrode fingers of reflectors on both sides is reduced. Reducing the number of the electrode fingers is enabled by using bulk waves in the thickness shear mode. A difference between lamb waves used in an acoustic wave device and bulk waves in the thickness shear mode will be described with reference to FIGS. 11A and 11B.

Figure 11A:
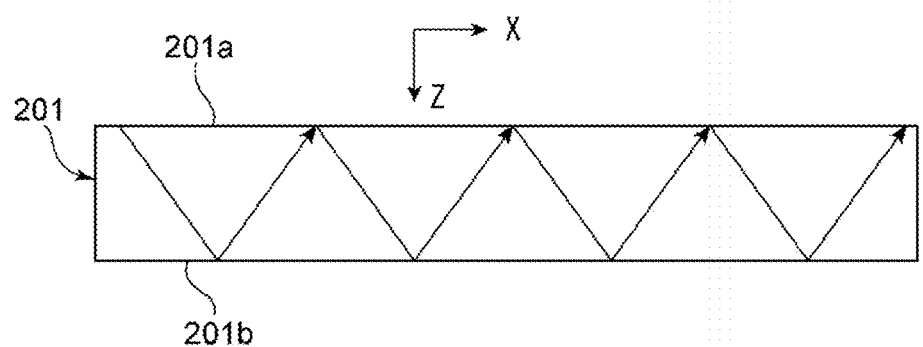
FIG. 11A is a schematic elevational cross-sectional view for describing lamb waves propagating through a piezoelectric film of an acoustic wave device.

FIG. 11A is a schematic elevational cross-sectional view for describing lamb waves that propagate in a piezoelectric film of an acoustic wave device such as that described in Japanese Unexamined Patent Application Publication No. 2012-257019. Here, waves propagate as indicated by arrows in a piezoelectric film 201. In the piezoelectric film 201, a first main surface 201a and a second main surface 201b face each other, and a thickness direction connecting the first main surface 201a and the second main surface 201b to each other is the Z-direction. The X-direction is a direction in which electrode fingers of an IDT electrode are disposed side by side. As illustrated in FIG. 11A, the waves of lamb waves propagate in the X-direction in the manner illustrated in FIG. 11A. Since the waves are plate waves, the waves propagate in the X-direction although the piezoelectric film 201 vibrates as a whole. Therefore, reflectors are disposed on both sides to obtain resonance characteristics. Therefore, propagation loss of the waves is generated, and the Q-value decreases when downsizing is performed, in other words, when the number of the electrode fingers is reduced.

Figure 11B:
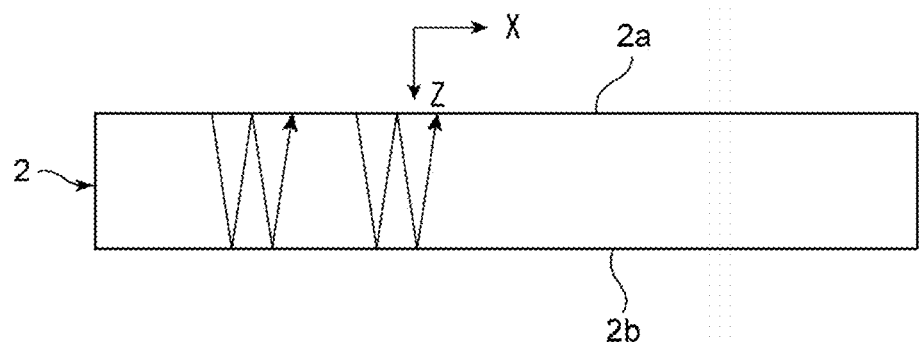
FIG. 11B is a schematic elevational cross-sectional view for describing bulk waves in a thickness shear mode propagating through a piezoelectric film in a filter device.

In contrast, as illustrated in FIG. 11B, vibration displacement in the acoustic wave device 1 is in the thickness shear direction, and thus, waves propagate substantially in a direction connecting the first main surface 2a and the second main surface 2b of the piezoelectric layer 2, that is, in the Z-direction and resonates. That is, the X-direction component of the waves is significantly smaller than the Z-direction component of the waves. Since resonance characteristics are obtained by the propagation of the waves in this Z-direction, propagation loss is unlikely to occur even when the number of the electrode fingers of reflectors is reduced. Further, even when the number of pairs of electrode pairs constituted by the electrodes 3 and 4 is reduced for downsizing, the Q-value is unlikely to decrease.

Figure 12:
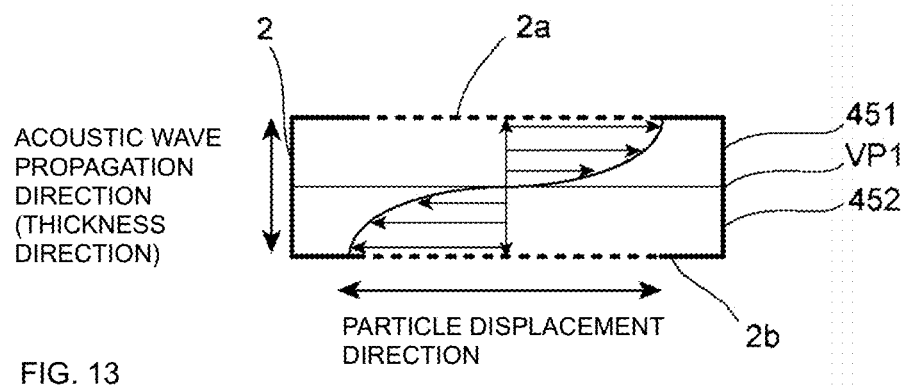
FIG. 12 illustrates an amplitude direction of bulk waves in a thickness shear mode.

As illustrated in FIG. 12, the amplitude direction of bulk waves in the thickness shear mode is opposite between a first region 451 included in the excitation regions C of the piezoelectric layer 2 and a second region 452 included in the excitation regions C. FIG. 12 schematically illustrates bulk waves when a voltage that causes the electrode 4 to have a higher potential than the electrode 3 is applied between the electrode 3 and the electrode 4. The first region 451 is a region included in the excitation regions C and present between the first main surface 2a and an imaginary plane VP1 orthogonal or substantially orthogonal to the thickness direction of the piezoelectric layer 2 and dividing the piezoelectric layer 2 into two. The second region 452 is a region included in the excitation regions C and present between the second main surface 2b and the imaginary plane VP1.

Although, as described above, at least one pair of electrodes including the electrode 3 and the electrode 4 is disposed in the acoustic wave device 1, the pair of electrodes is not for causing waves to propagate in the X-direction. Therefore, a plurality of pairs of the electrode pairs including the electrode 3 and the electrode 4 is not required. In other words, it is sufficient that at least one pair of the electrodes is provided.

For example, the electrode 3 is an electrode that is connected to a hot potential, and the electrode 4 is an electrode that is connected to a ground potential. The electrode 3, however, may be connected to a ground potential while the electrode 4 is connected to a hot potential. In the present preferred embodiment, at least one pair of the electrodes are, as described above, the electrode connected to the hot potential or the electrode connected to a ground potential, and no floating electrode is provided.

Figure 13:
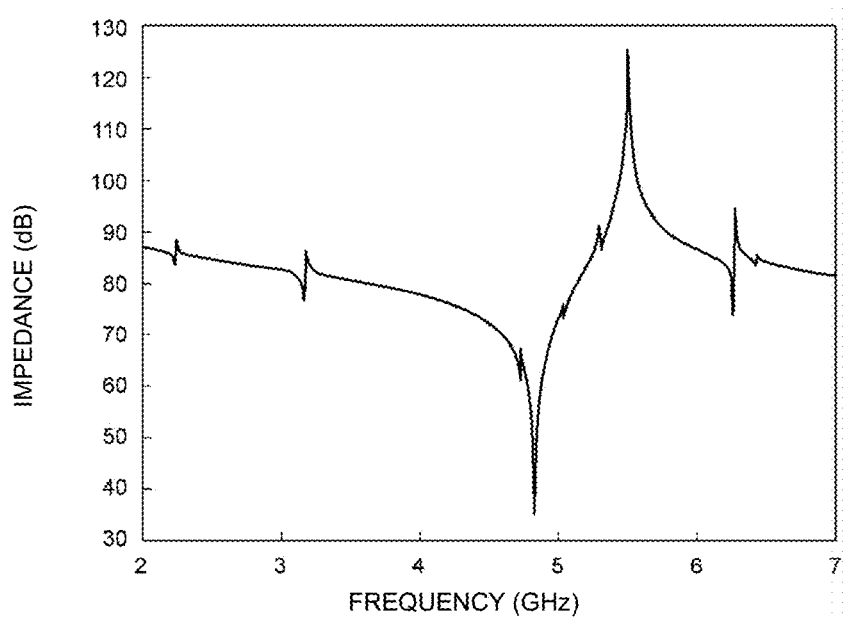
FIG. 13 is a graph showing resonance characteristics of a filter device that uses bulk waves in a thickness shear mode.

FIG. 13 is a graph showing resonance characteristics of the acoustic wave device illustrated in FIG. 10. Design parameters of the acoustic wave device 1 with which the resonance characteristics are obtained are as follows.

Piezoelectric layer 2: $LiNbO_3$ having Euler angles (about 0°, about 0°, about 90°), thickness=about 400 nm The length of a region in which the electrode 3 and the electrode 4 overlap each other when viewed in a direction orthogonal to the length directions of the electrode 3 and the electrode 4, in other words, the length of each of the excitation regions C=about 40 μm, the number of pairs of the electrodes constituted by the electrodes 3 and 4=21 pairs, the center-to-center distance between the electrodes=3 μm, the width of each of the electrodes 3 and 4=about 500 nm, and d/p=about 0.133

Electrically insulating layer 7: a silicon oxide film having a thickness of about 1 μm Support 8: Si The length of each of the excitation regions C is a dimension of each of the excitation regions C in the length directions of the electrodes 3 and 4.

In the present preferred embodiment, the distance between electrodes of an electrode pair including the electrodes 3 and 4 is the same or substantially the same among a plurality of the pairs. In other words, the electrodes 3 and the electrodes 4 are disposed at an equal or substantially equal pitch.

FIG. 13 clearly shows that satisfactory resonance characteristics in which the fractional band is about 12.5% can be obtained despite the absence of reflectors.

Meanwhile, as described above, d/p is, for example, less than or equal to about 0.5, where d is the thickness of the piezoelectric layer 2 and p is the center-to-center distance of the electrodes including the electrode 3 and the electrode 4, and d/p is more preferably, for example, less than or equal to about 0.24 in the present preferred embodiment. This will be described with reference to FIG. 14.

Figure 14:
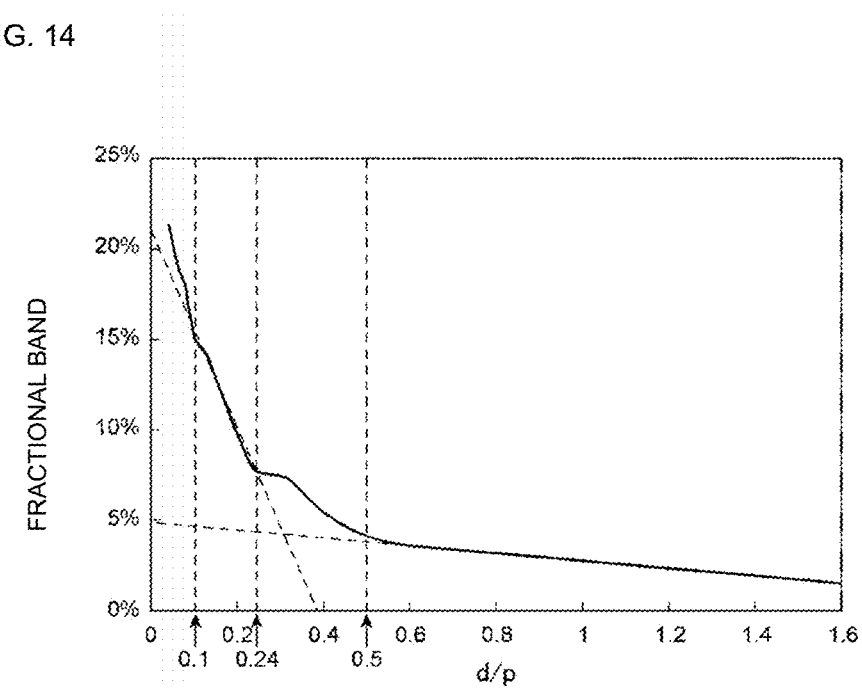
FIG. 14 is a graph showing a relationship between a fractional band as a resonator and d/p, where p is a center-to-center distance of electrodes adjacent to each other and d is a thickness of a piezoelectric layer.

A plurality of acoustic wave devices were obtained in the same manner, except that d/p was varied, as the acoustic wave device with which the resonance characteristics indicated in FIG. 13 were obtained. FIG. 14 is a graph showing a relationship between the d/p and the fractional band as resonators of acoustic wave devices.

FIG. 14 clearly shows that the fractional band is less than about 5% when d/p>about 0.5 is satisfied, even when d/p is adjusted. In contrast, when d/p≤about 0.5 is satisfied, it is possible to cause the fractional band to be more than or equal to about 5% by changing d/p within the range. In other words, it is possible to configure a resonator that has a high coupling coefficient. When d/p is less than or equal to about 0.24, the fractional band can be increased to be more than or equal to about 7%. In addition, by adjusting d/p within this range, it is possible to obtain a resonator having a wider fractional band and possible to achieve a resonator having a higher coupling coefficient. Accordingly, it is found that, by setting d/p to be less than or equal to about 0.5, it is possible to configure a resonator that uses bulk waves in the thickness shear mode and that has a high coupling coefficient.

Figure 15:
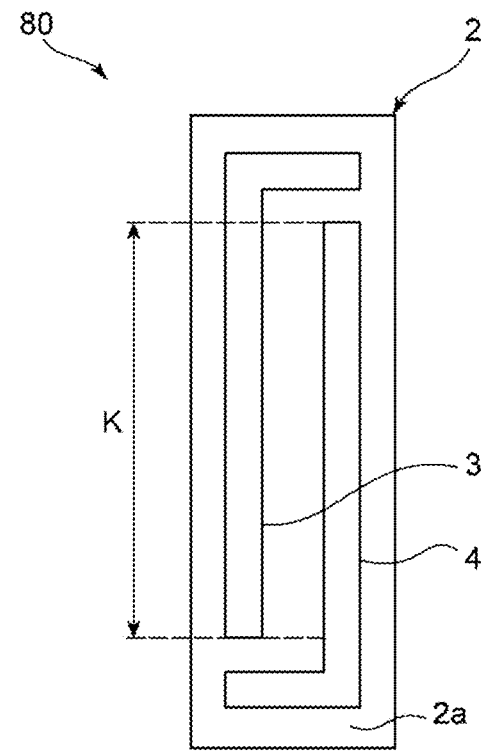
FIG. 15 is a plan view of an acoustic wave device that uses bulk waves in a thickness shear mode.

FIG. 15 is a plan view of an acoustic wave device that uses bulk waves in a thickness shear mode. In an acoustic wave device 80, a pair of electrodes including the electrode 3 and the electrode 4 is provided on the first main surface 2a of the piezoelectric layer 2. In FIG. 15, K is an intersection width. As described above, the number of pairs of electrodes may be one in the acoustic wave device of the present invention. It is also possible in this case to effectively excite bulk waves in a thickness shear mode when the aforementioned d/p is less than or equal to about 0.5.

Figure 16:
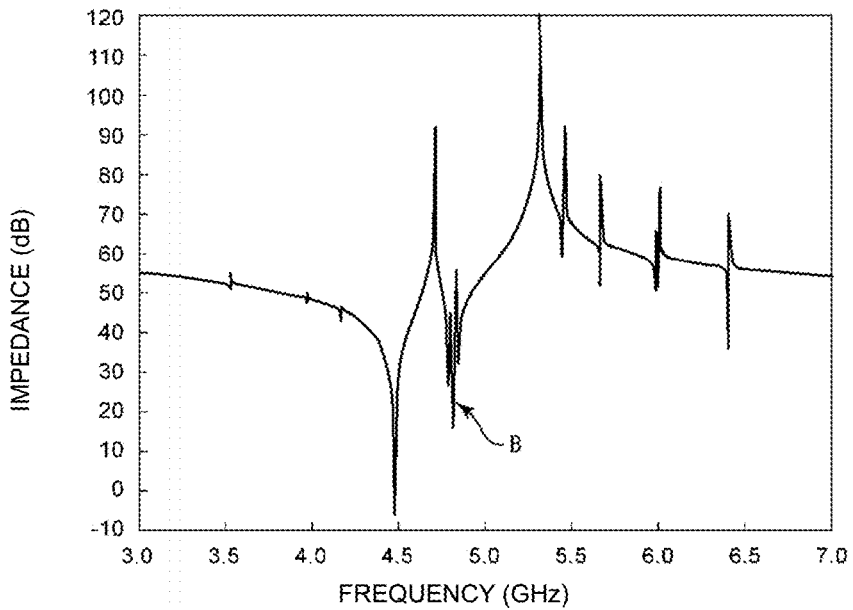
FIG. 16 is a graph showing resonance characteristics of an acoustic wave device in a reference example in which a spurious response appears.

Preferably, in the acoustic wave device 1, a metallization ratio MR of, among a plurality of the electrodes 3 and 4, electrodes 3 and 4 adjacent to each other with respect to the excitation region C, which is a region in which the electrodes 3 and 4 overlap each other when viewed in a direction in which the electrodes 3 and 4 adjacent to each other face each other, satisfies MR≤about 1.75(d/p)+0.075. In such a case, it is possible to effectively cause a spurious response to be small. This will be described with reference to FIG. 16 and FIG. 17. FIG. 16 is a reference graph showing one example of resonance characteristics of the acoustic wave device 1. A spurious response indicated by the arrow B has appeared between the resonant frequency and the anti-resonant frequency. Note that d/p=about 0.08 and LiNbO$_3$ has Euler angles (about 0°, about 0°, about 90°). In addition, note that the metallization ratio MR=about 0.35.

The metallization ratio MR will be described with reference to FIG. 9B. When one pair of the electrodes 3 and 4 has the electrode structure in FIG. 9B, it is assumed that only this one pair of the electrodes 3 and 4 is provided. In this case, a portion surrounded by the dashed dotted line C is an excitation region. This excitation region C is a region in the electrode 3 overlapping the electrode 4, a region in the electrode 4 overlapping the electrode 3, and, in a region between the electrode 3 and the electrode 4, a region in which the electrode 3 and the electrode 4 overlap each other when the electrode 3 and the electrode 4 are viewed in a direction orthogonal or substantially orthogonal to the length directions of the electrodes 3 and 4, that is, in the facing direction. The ratio of the areas of the electrodes 3 and 4 in the excitation region C to the area of this excitation region C is the metallization ratio MR. In other words, the metallization ratio MR is a ratio of the area of a metallization portion to the area of the excitation region C.

When a plurality of pairs of electrodes are provided, a ratio of the metallization portion included in all excitation regions to the total of the areas of the excitation regions can be considered as MR.

Figure 17:
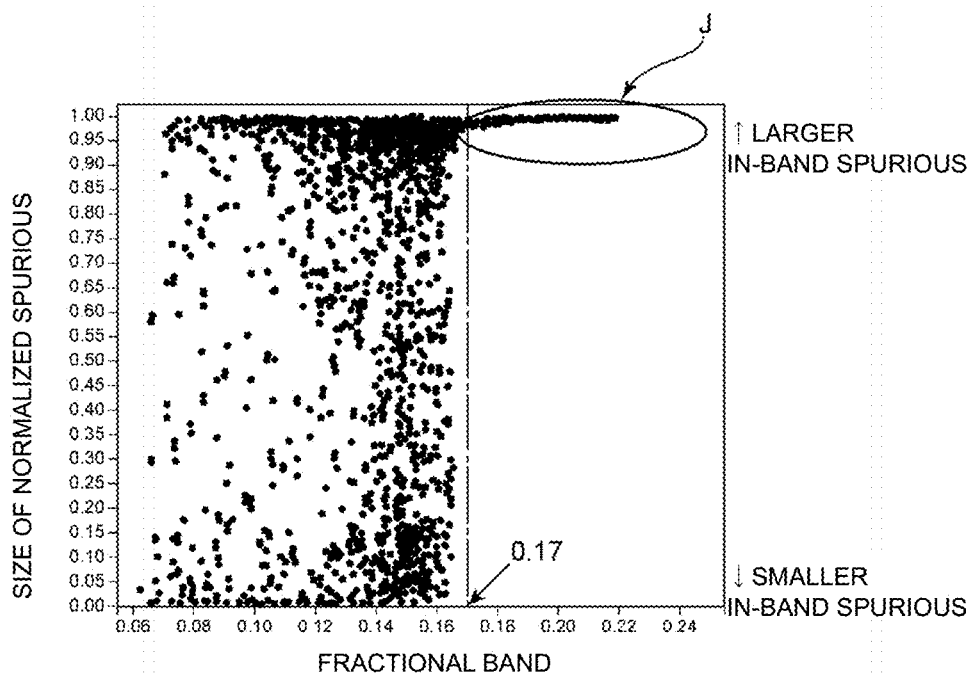
FIG. 17 is a graph showing a relationship between a fractional band and a phase rotation amount of an impedance of a spurious response normalized by 180 degrees as the size of the spurious response.

FIG. 17 is a graph showing a relationship between a fractional band when a large number of acoustic wave resonators are configured according to the present preferred embodiment and the phase rotation amount of an impedance of a spurious response normalized by 180 degrees as the size of the spurious response. The fractional band was adjusted by variously changing the film thickness of the piezoelectric layer and the dimensions of the electrodes. FIG. 16 shows results when a piezoelectric layer constituted by Z-cut LiNbO$_3$ was used. Tendency is, however, the same when a piezoelectric layer of the other cut-angle is used.

The spurious response is about 1.0, which is large, in a region surrounded by the ellipse J in FIG. 17. FIG. 17 clearly shows that when the fractional band exceeds about 0.17, in other words, exceeds about 17%, a large spurious response whose spurious level is more than or equal to about 1 appears in the pass band even when parameters that constitute the fractional band are changed. In other words, as with the resonance characteristics shown in FIG. 16, a large spurious response indicated by the arrow B appears in the band. Therefore, the fractional band is preferably less than or equal to about 17%. In this case, it is possible to cause the spurious response to be small by adjusting the film thickness of the piezoelectric layer 2, the dimensions of the electrodes 3 and 4, and the like.

Figure 18:
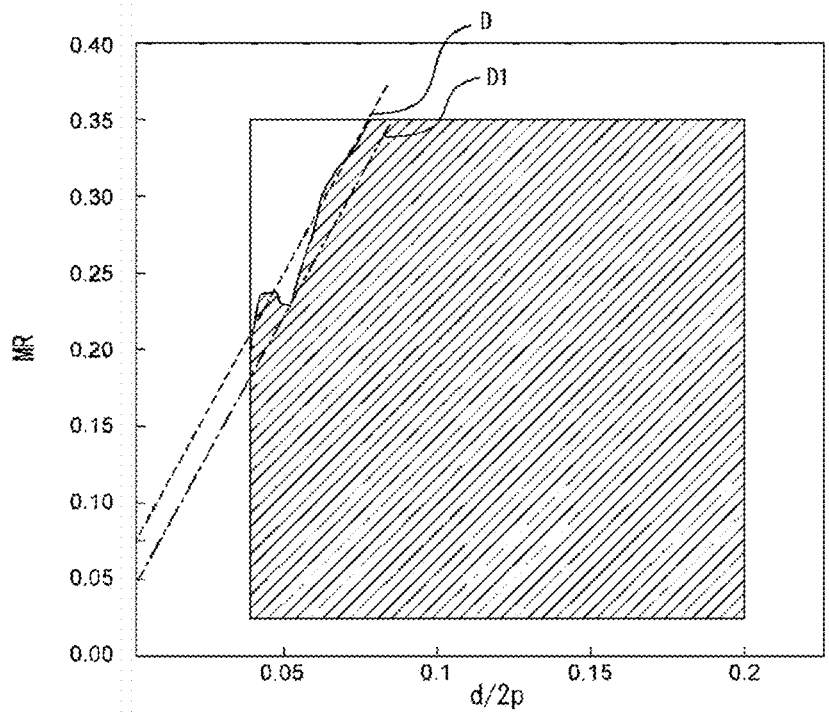
FIG. 18 is a graph showing a relationship between d/2p and a metallization ratio MR.

FIG. 18 is a graph showing a relationship among d/2p, the metallization ratio MR, and the fractional band. Various acoustic wave devices in which d/2p and MR are different from those in the above-described acoustic wave device were configured, and the fractional band was measured. In FIG. 18, a hatched portion on the right side of the dashed line D is a region in which the fractional band is less than or equal to about 17%. The boundary between the hatched region and a non-hatched region is expressed by MR=about 3.5(d/2p)+0.075. In other words, MR=about 1.75(d/p)+0.075. Thus, preferably, MR≤about 1.75(d/p)+0.075. In such a case, the fractional band is likely to be less than or equal to about 17%. A region on the right side of MR=about 3.5(d/2p)+0.05 indicated by the dashed dotted line D1 in FIG. 18 is more preferable. In other words, when MR≤about 1.75(d/p) +0.05 is satisfied, it is possible to reliably cause the fractional band to be less than or equal to about 17%.

Figure 19:
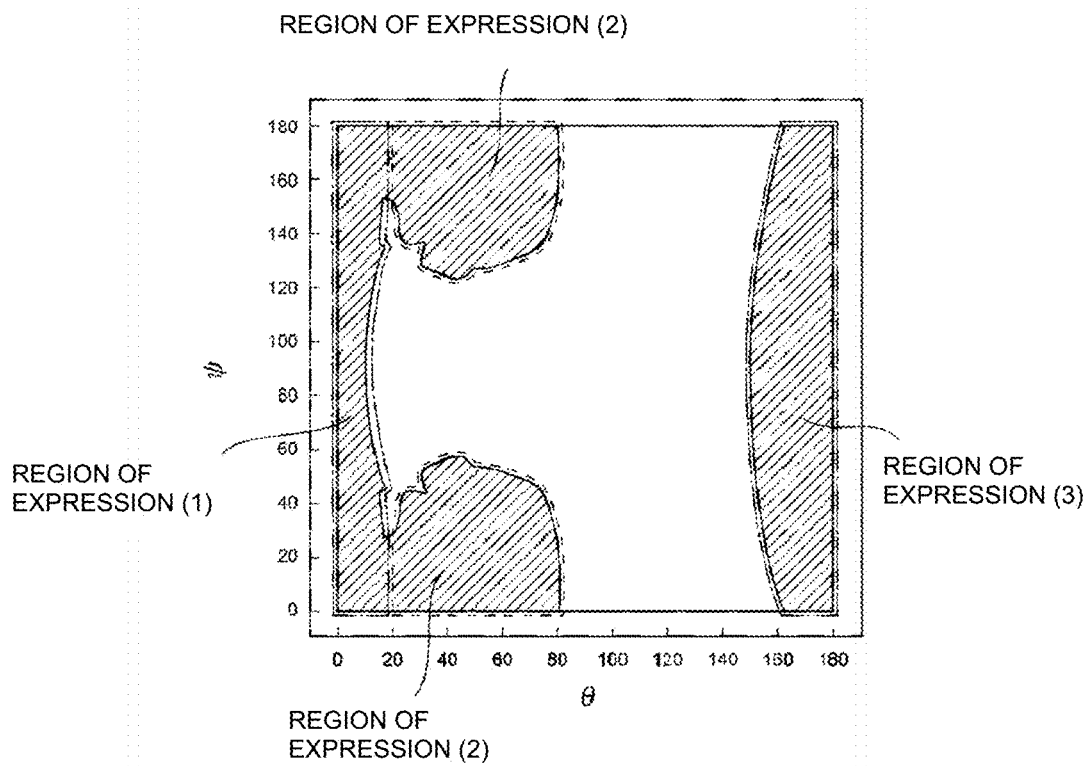
FIG. 19 is a graph showing a map of a fractional band with respect to Euler angles (0°, θ, ψ) of LiNbO₃ when d/p is approximated to zero as closely as possible.

FIG. 19 is a graph showing a map of the fractional band with respect to the Euler angles (0°, θ, ψ) of LiNbO₃ when d/p is approximated to zero as closely as possible. A hatched portion in FIG. 19 is a region in which a fractional band of at least more than or equal to 5% is obtained. When the range of the region is approximated, the range is expressed by following Expression (1), Expression (2), and Expression (3).

$$(0°\pm10°, 0° \text{ to } 20°, \text{any } \psi) \quad (1)$$

$$(0°\pm10°, 20° \text{ to } 80°, 0° \text{ to } 60° (1-(\theta-50)^2/900)^{1/2}) \text{ or } (0°\pm10°, 20° \text{ to } 80°, [180°-60° (1-(\theta-50)^2/900)^{1/2}] \text{ to } 180°) \quad (2)$$

$$(0°\pm10°, [180°-30° (1-(\psi-90)^2/8100)^{1/2}] \text{ to } 180°, \text{any } \psi) \quad (3)$$

Accordingly, in the Euler angle range expressed by Expression (1), Expression (2), or Expression (3) above, the fractional band can be sufficiently widened, which is preferable.

Figure 20:
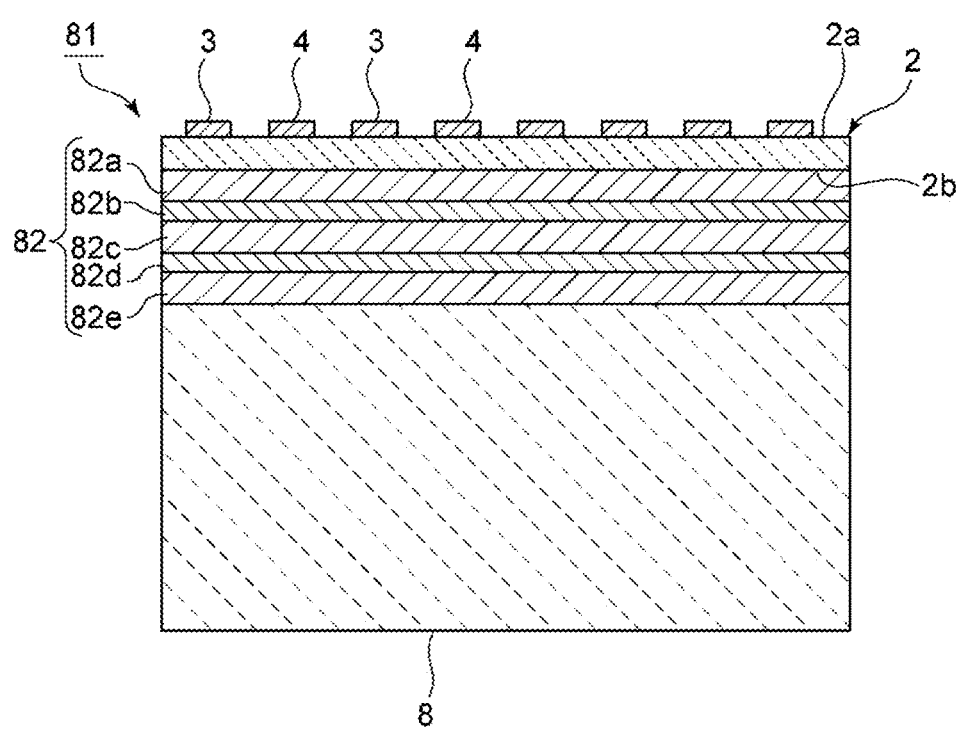
FIG. 20 is an elevational cross-sectional view of an acoustic wave device that includes an acoustic multilayer film according to a preferred embodiment of the present invention.

FIG. 20 is an elevational cross-sectional view of an acoustic wave device that includes an acoustic multilayer film according to a preferred embodiment of the present invention. In an acoustic wave device 81, an acoustic multilayer film 82 is laminated on the second main surface 2b of the piezoelectric layer 2. The acoustic multilayer film 82 has a multilayer structure including low-acoustic-impedance layers 82a, 82c, and 82e each having a relatively low acoustic impedance and high-acoustic-impedance layers 82b and 82d each having a relatively high acoustic impedance. When using the acoustic multilayer film 82, it is possible without using the cavity portion 9 in the acoustic wave device 1 to confine bulk waves in the thickness shear mode inside the piezoelectric layer 2. It is also possible in the acoustic wave device 81 to obtain resonance characteristics based on bulk waves in the thickness shear mode by setting d/p to be less than or equal to about 0.5. In the acoustic multilayer film 82, the number of the low-acoustic-impedance layers 82a, 82c, and 82e and the high-acoustic-impedance layers 82b and 82d is not particularly limited. It is sufficient that at least one layer of the high-acoustic-impedance layer 82b or 82d is disposed on the side farther than the low-acoustic-impedance layers 82a, 82c, and 82e from the piezoelectric layer 2.

As long as the relationship of the acoustic impedance is satisfied, the low-acoustic-impedance layers 82a, 82c, and 82e and the high-acoustic-impedance layers 82b and 82d can be each constituted by an appropriate material.

An example of the material of the low-acoustic-impedance layers 82a, 82c, and 82e is silicon oxide, silicon nitride, or the like. An example of the material of the high-acoustic-impedance layers 82b and 82d is alumina, silicon nitride, metal, or the like.

In the first preferred embodiment and the like illustrated in FIG. 2, the support 8 may be provided with the cavity portion 9 as illustrated in FIG. 10 in at least one of the first acoustic wave resonator and the second acoustic wave resonator. In at least one of the first acoustic wave resonator and the second acoustic wave resonator, at least a portion of the IDT electrode and the cavity portion 9 may overlap each other in plan view.

In at least one of the first acoustic wave resonator and the second acoustic wave resonator, as illustrated in FIG. 20, the acoustic multilayer film 82 as an acoustic reflection film may be provided between the support 8 and the piezoelectric layer 2.

In at least one of the first acoustic wave resonator and the second acoustic wave resonator, d/p is preferably, for example, less than or equal to about 0.24. Consequently, more satisfactory resonance characteristics can be obtained.

In at least one of the first acoustic wave resonator and the second acoustic wave resonator, it is preferable that MR≤about 1.75(d/p)+0.075 be satisfied, as described above. In this case, a spurious response is more reliably reduced or prevented.

In at least one of the first acoustic wave resonator and the second acoustic wave resonator, the Euler angles (ϕ, θ, ψ) of lithium niobate of the piezoelectric layer are preferably within the range of Expression (1), Expression (2), or Expression (3) above. In this case, the fractional band can be sufficiently widened.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a first acoustic wave resonator; and
   a second acoustic wave resonator; wherein
   each of the first acoustic wave resonator and the second acoustic wave resonator includes a support, a piezoelectric layer on the support, X-axis, a Y-axis, and a Z-axis that are crystal axes, is made of Y-cut lithium niobate, and includes an IDT electrode on the piezoelectric layer;
   the IDT electrode of each of the first acoustic wave resonator and the second acoustic wave resonator includes a first busbar and a second busbar that face each other, a plurality of first electrode fingers each including one end connected to the first busbar, and a plurality of second electrode fingers each including one end connected to the second busbar and being interdigitated with the plurality of first electrode fingers;
   in each of the first acoustic wave resonator and the second acoustic wave resonator, d/p is less than or equal to about 0.5, where d is a thickness of the piezoelectric layer and p is a center-to-center distance of the first electrode fingers and the second electrode fingers adjacent to each other;
   when an imaginary line connecting tips of the plurality of first electrode fingers is an envelope in each of the first acoustic wave resonator and the second acoustic wave resonator, a direction in which the envelope extends and a direction of the X-axis intersect each other; and
   an absolute value of a first slant angle β1 and an absolute value of a second slant angle α2 differ from each other, the first slant angle β1 being an angle of a corner defined by the direction in which the envelope extends and the direction of the X-axis and being an angle other than 0° in the first acoustic wave resonator, and the second slant angle β2 being an angle of a corner defined by the direction in which the envelope extends and the direction of the X-axis and being an angle other than 0° in the second acoustic wave resonator.

2. The filter device according to claim 1, wherein the absolute value of at least one of the first slant angle β1 and the second slant angle β2 is more than or equal to about 10°.

3. The filter device according to claim 1, wherein the filter device is a ladder filter, and the first acoustic wave resonator and the second series arm resonator are series arm resonators.

4. The filter device according to claim 1, wherein the filter device is a ladder filter, and the first acoustic wave resonator and the second acoustic wave resonator are parallel arm resonators.

5. The filter device according to claim 3, wherein the first acoustic wave resonator and the second acoustic wave resonator are each divided in series or divided in parallel.

6. The filter device according to claim 1, wherein, in at least one of the first acoustic wave resonator and the second acoustic wave resonator, the support includes a cavity portion that is open on a side of the piezoelectric layer, and at least a portion of the IDT electrode overlaps the cavity portion in plan view.

7. The filter device according to claim 1, wherein
at least one of the first acoustic wave resonator and the second acoustic wave resonator includes an acoustic reflection film between the support and the piezoelectric layer; and
the acoustic reflection film includes at least one low-acoustic-impedance layer that has a relatively low acoustic impedance and at least one high-acoustic-impedance layer that has a relatively high acoustic impedance, the low-acoustic-impedance layer and the high-acoustic-impedance layer being alternately laminated on each other.

8. The filter device according to claim 1, wherein a cut-angle of the lithium niobate of the piezoelectric layer of at least one of the first acoustic wave resonator and the second acoustic wave resonator is within a range of about 128°±10° Y-cut.

9. The filter device according to claim 1, wherein a pass band is about 3400 MHz to about 4200 MHz.

10. The filter device according to claim 1, wherein d/p is less than or equal to about 0.24 in at least one of the first acoustic wave resonator and the second acoustic wave resonator.

11. The filter device according to claim 1, wherein, in at least one of the first acoustic wave resonator and the second acoustic wave resonator, MR≤about 1.75 (d/p)+0.075 is satisfied, where MR is a metallization ratio of the plurality of electrode fingers with respect to an excitation region in which the first electrode fingers and the second electrode fingers that are adjacent to each other overlap each other when viewed in a direction in which the first electrode fingers and the second electrode fingers face each other.

12. The filter device according to claim 1, wherein, in at least one of the first acoustic wave resonator and the second acoustic wave resonator, Euler angles ($\phi$, $\theta$, $\psi$) of the lithium niobate that constitutes the piezoelectric layer are within a range of following Expression (1), Expression (2), or Expression (3):

$$(0°±10°, 0° \text{ to } 20°, \text{any } \psi) \tag{1}$$

$$(0°±10°, 20° \text{ to } 80°, 0° \text{ to } 60° (1-(\theta-50)^2/900)^{1/2}) \text{ or } \\ (0°±10°, 20° \text{ to } 80°, [180°-60° (1-(\theta-50)^2/900)^{1/2}] \text{ to } 180°) \tag{2}$$

$$(0°±10°, [180°-30° (1-(\psi-90)^2/8100)^{1/2}] \text{ to } 180°, \text{any } \psi) \tag{3}$$

13. The filter device according to claim 1, wherein
the IDT electrode includes a Ti layer and an Al layer laminated on each other; and
the Ti layer is closer to the piezoelectric layer than the Al layer.

14. The filter device according to claim 1, wherein a thickness of the piezoelectric layer is more than or equal to about 40 nm and less than or equal to about 1000 nm.

15. The filter device according to claim 1, wherein a thickness of the piezoelectric layer is more than or equal to about 50 nm and less than or equal to about 1000 nm.

16. The filter device according to claim 1, wherein a pitch between adjacent ones of the first and second electrode fingers is within the range from about 1 μm to about 10 μm.

17. The filter device according to claim 1, wherein a width of each of the first and second electrode fingers is within the range from about 50 nm to about 1000 nm.

18. The filter device according to claim 1, wherein a width of each of the first and second electrode fingers is within the range from about 150 nm to about 1000 nm.

19. The filter device according to claim 1, wherein an electrically insulating layer is interposed between the support and the piezoelectric layer.

20. The filter device according to claim 19, wherein the electrically insulating layer has a frame shape.

* * * * *